(12) United States Patent
Lee et al.

(10) Patent No.: US 7,800,134 B2
(45) Date of Patent: Sep. 21, 2010

(54) CMOS INTEGRATED CIRCUIT DEVICES HAVING STRESSED NMOS AND PMOS CHANNEL REGIONS THEREIN

(75) Inventors: Kyoung-woo Lee, Seoul (KR); Ja-hum Ku, Gyeonggi-do (KR); Jae-eon Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/420,936

(22) Filed: Apr. 9, 2009

(65) Prior Publication Data

US 2009/0194817 A1      Aug. 6, 2009

Related U.S. Application Data

(63) Continuation of application No. 11/691,691, filed on Mar. 27, 2007, now Pat. No. 7,534,678.

(51) Int. Cl.
*H01L 29/78* (2006.01)
(52) U.S. Cl. .................. 257/202; 257/E29.264
(58) Field of Classification Search .......... 257/202, 257/204, 365, E21.632, E29.255, E29.264; 438/200, 233, 634, 637
See application file for complete search history.

(56) References Cited

U.S. PATENT DOCUMENTS

| | | | |
|---|---|---|---|
| 5,731,617 A | 3/1998 | Suda | |
| 6,184,157 B1 | 2/2001 | Hsu et al. | |
| 6,372,589 B1 | 4/2002 | Yu | |

(Continued)

FOREIGN PATENT DOCUMENTS

JP      06-163578      6/1994

(Continued)

OTHER PUBLICATIONS

U.S. Appl. No. 11/831,223, filed Jul. 31, 2007, Nam et al.

(Continued)

*Primary Examiner*—W. David Coleman
*Assistant Examiner*—Daniel Shook
(74) *Attorney, Agent, or Firm*—Myers Bigel Sibley & Sajovec

(57) ABSTRACT

Methods of forming CMOS integrated circuit devices include forming at least first, second and third transistors in a semiconductor substrate and then covering the transistors with one or more electrically insulating layers that impart a net stress (tensile or compressive) to channel regions of the transistors. The covering step may include covering the first and second transistors with a first electrically insulating layer having a sufficiently high internal stress characteristic to impart a net tensile (or compressive) stress in a channel region of the first transistor and covering the second and third transistors with a second electrically insulating layer having a sufficiently high internal stress characteristic to impart a net compressive (or tensile) stress in a channel region of the third transistor. A step may then performed to selectively remove a first portion of the second electrically insulating layer extending opposite a gate electrode of the second transistor. In addition, a step may be performed to selectively remove a first portion of the first electrically insulating layer extending opposite a gate electrode of the first transistor and a second portion of the second electrically insulating layer extending opposite a gate electrode of the third transistor.

7 Claims, 7 Drawing Sheets

U.S. PATENT DOCUMENTS

| | | |
|---|---|---|
| 6,869,866 B1 | 3/2005 | Chidambarrao et al. |
| 7,022,561 B2 | 4/2006 | Huang et al. |
| 7,052,946 B2 | 5/2006 | Chen et al. |
| 7,189,624 B2 | 3/2007 | Ito |
| 7,297,584 B2 | 11/2007 | Park et al. |
| 7,396,718 B2 | 7/2008 | Frohberg et al. |
| 7,482,215 B2 | 1/2009 | Dyer et al. |
| 7,534,678 B2 | 5/2009 | Lee et al. |
| 2003/0040158 A1 | 2/2003 | Saitoh |
| 2004/0021160 A1 | 2/2004 | Eguchi et al. |
| 2005/0048732 A1 | 3/2005 | Park et al. |
| 2005/0093078 A1 | 5/2005 | Chan et al. |
| 2005/0098829 A1 | 5/2005 | Doris et al. |
| 2005/0199963 A1 | 9/2005 | Aoyama |
| 2005/0218455 A1 | 10/2005 | Maeda et al. |
| 2005/0230756 A1 | 10/2005 | Chang et al. |
| 2006/0011586 A1 | 1/2006 | Shea |
| 2006/0019438 A1 | 1/2006 | Harakawa |
| 2006/0046400 A1* | 3/2006 | Burbach et al. ............. 438/282 |
| 2006/0094193 A1 | 5/2006 | Horstmann et al. |
| 2006/0118879 A1 | 6/2006 | Li |
| 2007/0099360 A1* | 5/2007 | Lee et al. .................... 438/197 |
| 2007/0252230 A1 | 11/2007 | Zhu et al. |
| 2007/0257336 A1 | 11/2007 | Matsumoto |
| 2008/0026523 A1 | 1/2008 | Lee et al. |
| 2008/0050869 A1 | 2/2008 | Sudo |
| 2008/0073713 A1 | 3/2008 | Kim et al. |
| 2009/0101945 A1 | 4/2009 | Yamaguchi et al. |

FOREIGN PATENT DOCUMENTS

| | | |
|---|---|---|
| JP | 10-177938 | 6/1998 |
| JP | 2001-352055 A | 12/2001 |
| JP | 2003-060076 | 2/2003 |
| JP | 2003086704 | 3/2003 |
| JP | 2003-273240 | 9/2003 |
| JP | 2003273240 | 9/2003 |
| JP | 2004047608 | 2/2004 |
| JP | 2004128316 | 4/2004 |
| JP | 2005-064314 | 3/2005 |
| JP | 2006080161 | 3/2006 |
| JP | 2006-173432 A | 6/2006 |
| JP | 2006-237070 A | 9/2006 |
| KR | 10-1997-0018691 A | 4/1997 |
| KR | 100183785 B1 | 12/1998 |
| KR | 10-2001-0076522 A | 8/2001 |
| KR | 1020020017845 A | 3/2002 |
| KR | 1020020074551 A | 10/2002 |
| KR | 1020030076354 A | 9/2003 |
| KR | 1020040070794 A | 6/2004 |
| KR | 10-2004-0107477 | 12/2004 |
| KR | 1020050049243 A | 5/2005 |
| KR | 1020060000912 A | 1/2006 |
| KR | 1020060004595 A | 1/2006 |
| KR | 1020060119773 A | 11/2006 |

OTHER PUBLICATIONS

U.S. Appl. No. 11/874,118, filed Oct. 17, 2007, Nam et al.

Korean Office Action (3 pages) corresponding to Korean Application No. 10-2006-0128876; Dated: Oct. 24, 2007.

* cited by examiner

CMOS INTEGRATED CIRCUIT DEVICES HAVING STRESSED NMOS AND PMOS CHANNEL REGIONS THEREIN

REFERENCE TO PRIORITY APPLICATION

This application is a continuation of U.S. patent application Ser. No. 11/691,691, filed Mar. 27, 2007, now U.S. Pat. No. 7,534,678 the disclosure of which is hereby incorporated herein by reference.

FIELD OF THE INVENTION

The present invention relates to integrated circuit device fabrication methods and, more particularly, to CMOS integrated circuit device fabrication methods and devices formed thereby.

BACKGROUND OF THE INVENTION

Methods of fabricating transistors having excellent performance characteristics have been researched. In order to implement high-performance transistors, many methods of increasing the mobility of electrons or holes have been developed. Methods of increasing the mobility of electrons or holes in MOSFETs include methods of changing the energy band structure of a channel region by applying physical stress to the channel region. For example, in the case of an NMOS transistor, the performance thereof may be improved when tensile stress is applied to a channel, and in the case of a PMOS transistor, the performance thereof may be improved when compressive stress is applied to a channel. Moreover, because the performance of the NMOS transistor and the PMOS transistor can be simultaneously improved by forming a tensile stress layer in the NMOS transistor and a compressive stress layer in the PMOS transistor, it may be preferable to employ dual stress layers. In the case where dual stress layers are employed, a region may exist in which a tensile stress layer and a compressive stress layer partially overlap each other in a boundary region between an NMOS transistor and a PMOS transistor. The region in which the stress layers overlap each other may be thicker than those regions having a single stress layer. Accordingly, if a contact hole passing through a single stress layer and a contact hole passing through the overlap region are simultaneously formed through an etching process, a lower structure may not be exposed and part of a stress layer may remain in the overlap region even though the contact hole in the single stress layer exposes the lower structure. Accordingly, contact may not be achieved in the overlap region. Furthermore, when etching is performed for a sufficient period or using high-concentration etching gas so as to completely pass through the overlap region, a contact hole is formed in the single stress layer. When this occurs, the lower structure may be excessively exposed to the etching gas, and the lower structure may be damaged.

SUMMARY OF THE INVENTION

Methods of forming CMOS integrated circuit devices according to embodiments of the present invention include forming at least first, second and third transistors in a semiconductor substrate and then covering the transistors with one or more electrically insulating layers that impart a net stress (tensile or compressive) to channel regions of the transistors. In particular, a plurality of covering steps may be performed. These covering steps may include covering the first and second transistors with a first electrically insulating layer having a sufficiently high internal stress characteristic to impart a net tensile (or compressive) stress in a channel region of the first transistor and covering the second and third transistors with a second electrically insulating layer having a sufficiently high internal stress characteristic to impart a net compressive (or tensile) stress in a channel region of the third transistor. A step may then performed to selectively remove a first portion of the second electrically insulating layer extending opposite a gate electrode of the second transistor. This selective removal step may be performed using a selective etching technique. An additional selective removal step may also be performed. This step includes selectively removing a first portion of the first electrically insulating layer extending opposite a gate electrode of the first transistor and a second portion of the second electrically insulating layer extending opposite a gate electrode of the third transistor.

According to additional embodiments of the invention, the step of covering the second and third transistors can be preceded by a step of forming an etching stop layer on the first electrically insulating layer. Under these conditions, the step of selectively removing a first portion of the first electrically insulating layer may be preceded by a step of selectively removing portions of the etching stop layer extending opposite the gate electrodes of the first and second transistors. In addition, the step of selectively removing a first portion of the second electrically insulating layer may be preceded by a step of forming an interlayer dielectric layer on the first and second electrically insulating layers and then forming one or more contact holes in the interlayer dielectric layer. The step of selectively removing a first portion of the second electrically insulating layer may be preceded by a step of forming a first contact hole in the interlayer dielectric layer to thereby expose the first portion of the second electrically insulating layer. The step of selectively removing a first portion of the first electrically insulating layer may be preceded by a step of forming second and third contact holes in the interlayer dielectric layer to thereby expose a portion of the etching stop layer extending opposite the gate electrode of the first transistor and expose the second portion of the second electrically insulating layer, respectively. The portion of the etching stop layer exposed by the second contact hole may then be selectively etched to thereby expose the first portion of the first electrically insulating layer.

According to additional aspects of these embodiments, the first (and second) electrically insulating layer may be an electrically insulating material selected from a group consisting of SiN, SiON, SiC, SiCN and $SiO_2$ and combinations thereof and the etching stop layer may include a low temperature oxide (LTO) layer. In addition, the transistor-forming step may be preceded by a step of forming a trench isolation region in the semiconductor substrate and a portion of the gate electrode of the second transistor may be formed to extend on the trench isolation region.

Still further embodiments of the present invention include a CMOS integrated circuit device. This device includes a semiconductor substrate having a plurality of transistors therein. A first electrically insulating layer is provided on first and second ones of the plurality of transistors. This first electrically insulating layer has a sufficiently high internal stress characteristic to impart a net tensile stress in a channel region of the first one of the plurality of transistors. A second electrically insulating layer is provided on the second one and a third one of the plurality of transistors. The second electrically insulating layer has a sufficiently high internal stress characteristic to impart a net compressive stress in a channel region of the third one of the plurality of transistors. An interlayer dielectric layer is provided on the first and second electrically insulating layers and a contact plug is provided that extends through the first and second electrically insulating layers and electrically contacts a gate electrode of the second one of the plurality of transistors. The first and third ones of the plurality of transistors may be of opposite conductivity type (e.g., NMOS and PMOS).

DESCRIPTION OF THE PREFERRED EMBODIMENTS

Figure 1:
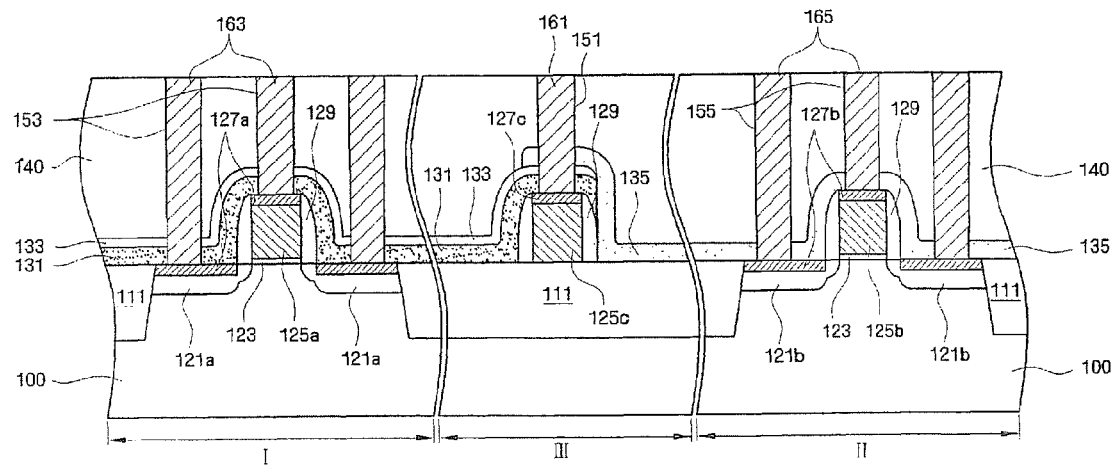
FIG. 1 is a cross-sectional view of a CMOS integrated circuit device according to an embodiment of the present invention.

The advantages and characteristics of the present invention and methods of achieving them will be apparent with reference to embodiments described in detail in conjunction with the accompanying drawings. However, the present invention is not limited to the embodiments that will be disclosed below, but may be implemented in various forms. The embodiments are provided to complete the disclosure of the present invention and to inform those skilled in the art of the details of the present invention. The present invention is defined by the accompanying claims.

The terms used in the present specification are used to describe the illustrated embodiments, and are not intended to limit the present invention. In the present invention, a singular form includes a plural form as long as not stated otherwise in related descriptions. The terms "comprises" and "comprising" are each used to mean that the existence of additional elements, steps, operations or devices other than the recited elements, steps, operations, or devices is included. Furthermore, the term "and/or" means that respective items described and all combinations thereof are included. The same reference characters refer to the same elements throughout the present specification.

Furthermore, the embodiments described in the present specification will be described with reference to sectional views and schematic views, which are illustrative views of the present invention. Accordingly, the illustrative views may be modified according to manufacturing technology and/or allowable error. The embodiments of the present invention are not limited to specific illustrated configurations, but include configurations obtained through modification for specific manufacturing processes. Furthermore, in respective accompanying drawings, respective elements may be illustrated in a somewhat enlarged or reduced form for convenience of description.

Although a description is given below using an NMOS transistor as a first transistor, a PMOS transistor as a second transistor, a tensile stress layer as a first stress layer, and a compressive stress layer as a second stress layer, the present invention is not limited thereto. That is, the conduction types of the transistors and the types of the stress layers may be reversed, or may be the same.

Referring now to FIG. 1, the semiconductor device according to the embodiment of the present invention includes a semiconductor substrate 100 having an NMOS transistor region I and a PMOS transistor region II therein. A specific boundary region III may also exist between the NMOS transistor region I and the PMOS transistor region II. In the semiconductor substrate 100, active regions are shown to extend between device isolation regions 111. Although a substrate made of one or more semiconductor materials selected from the group consisting of Si, Ge, SiGe, GaP, GaAs, SiC, SiGeC, InAs and InP, or a Silicon On Insulator (SOI) may be used as the substrate 100, these are only examples. Although not shown in FIG. 1, a P-type well may be formed in the NMOS transistor region I of the semiconductor substrate 100, and an N-type well may be formed in the PMOS transistor region II of the semiconductor substrate 100, if necessary.

An NMOS transistor located in the NMOS transistor region I includes a gate electrode 125a formed on a gate insulating layer 123, and source/drain regions 121a formed in the substrate 100 on both sides of the gate electrode 125a and doped with an N-type impurity. The gate electrode 125a may be a single layer, such as a polysilicon layer or a metal layer, or a composite layer containing multiple materials. In this case, although a polysilicon layer may be an N-type impurity-doped polysilicon layer, the polysilicon layer is not limited thereto. The polysilicon layer may also be of a conduction type identical to that of the gate electrode 125b of a PMOS transistor, hereinbelow.

A spacer 129 is located on the side walls of the gate electrode 125a, and a first silicide layer 127a may be formed on the gate electrode 125a and the source/drain regions 121a. The metal component of the first silicide layer 127a may be Co, Ni, Ti, Ta, or W; however, the metals may also be used.

The PMOS transistor located in the PMOS transistor region II includes a gate electrode 125b formed on the gate insulating layer 123, and source/drain regions 121b formed in the substrate 100 on both sides of the gate electrode 125b and doped with a P-type impurity. The gate electrode 125b may be a single layer, such as a polysilicon layer or a metal layer, or a composite layer. The polysilicon layer may be made of polysilicon doped with a P-type impurity. Although it is preferred that the gate electrode 125a of the NMOS transistor and the gate electrode 125b of the PMOS transistor be of different conductivity types, the case where the two gate electrodes are of the same conductivity type is not excluded.

A spacer 129 is located on the side wall of the gate electrode 125b and a second silicide layer 127b is formed on the gate electrode 125b and the source/drain regions 121b. The metal component of the second silicide layer 127b may be Co, Ni, Ti, Ta or W; however, other metals may also be used.

A gate electrode 125c provided with a third silicide layer 127c thereon may exist in the boundary region III located between the NMOS transistor region I and the PMOS transistor region II. As illustrated in FIG. 1, although a gate electrode 125c may be located on the device isolation region 111, the gate electrode 125c may also be located in an active region. Furthermore, although not shown in FIG. 1, a source/drain region provided with a silicide layer thereon may be located in the boundary region III.

A tensile stress layer 131 capable of applying tensile stress to the channel region of the NMOS transistor is located on the NMOS transistor region I. The tensile stress layer 131 can increase the mobility of carriers by applying tensile stress to the channel region of the NMOS transistor. The tensile stress layer 131 may be, for example, an SiN, SiON, SiC, SiCN or $SiO_2$ layer, or a layer formed of a combination thereof. The tensile stress layer 131 may also be formed of other materials. The thickness of the tensile stress layer 131 may be appropriately adjusted within a range of about 50~1000 Å.

An etching stop layer 133 may be located on the tensile stress layer 131. A Low Temperature Oxide (LTO) layer may be used as the etching stop layer 133, but the etching stop layer 133 is not limited thereto. The etching stop layer 133 may be placed on the tensile stress layer 131 or a compressive stress layer 135 depending on whether the tensile stress layer 133 or the compressive stress layer 135, which will be described hereinbelow, is formed first in a fabrication process.

The compressive stress layer 135, which is capable of applying compressive stresses to the channel region of the PMOS transistor, is located in the PMOS transistor region II. The compressive stress layer 135 can increase the mobility of carriers by applying compressive stress to the channel region of the PMOS transistor. The compressive stress layer 135 may be, for example, an SiN, SiON, SiC, SiCN or $SiO_2$ layer, or a layer formed of a combination thereof. The compressive stress layer 135 may also be formed of other materials. The thickness of the compressive stress layer 135 may be appropriately adjusted within a range of about 50~1000 Å.

In the boundary region III, the tensile stress layer 131, the etching stop layer 133 and the compressive stress layer 135 may overlap, as illustrated. That is, the tensile stress layer 131, the etching stop layer 133 and the compressive stress layer 135 extend to the boundary region III. In an embodiment of the present invention, there is a laminate layer in which the tensile stress layer 131, the etching stop layer 133 and the compressive stress layer 135 are laminated together on the third silicide layer 127c located in the boundary region III. This laminate layer may be formed in a region in which mask patterns overlap each other at the time of patterning the dual stress layers.

An interlayer dielectric layer 140 covering the entire surface of the substrate 100 is placed over the NMOS transistor region I, the PMOS transistor region II and the boundary region III. First to third contact holes 151, 153, and 155 are formed through the interlayer dielectric layer 140. The first contact hole 151 is located in the boundary region III, and is formed through the interlayer dielectric 140, the compressive stress layer 135, the etching stop layer 133, and the tensile stress layer 131. The bottom of the first contact hole 151 is located on the top surface of the third silicide layer 127c or within the third silicide layer 127c. The second contact hole 153 is located in the NMOS transistor region I, and is formed through the interlayer dielectric layer 140, the etching stop layer 133 and the tensile stress layer 131. The bottom of the second contact hole 153 is located on the top surface of the first silicide layer 127a or within the first silicide layer 127a. The third contact hole 155 is located in the PMOS transistor region II, and is formed through the interlayer dielectric 140 and the compressive stress layer 135. The bottom of the third contact hole 155 is located on the top surface of the second silicide layer 127b or within the second silicide layer 127b.

Contact plugs 161, 163 and 165 made of conductive material are respectively formed in the first to third contact holes 151, 153 and 155. The bottoms of the contact plugs 161, 163 and 165 are respectively located on the top surfaces of the first to third silicide layers 127c or within the first to third silicide layers 127c. The contact plugs 161, 163 and 165 may be filled with metal material, such as W, Cu or Al, or conductive material such as conductive polysilicon. Although not shown in FIGS. 1-15, barrier layers may be formed as linings in the contact holes 151, 153 and 155 and then filled with the conductive materials. Each of the barrier layers (not shown) may include an ohmic layer for improving the contact of the metal layer filling each of the contact holes 151, 153 and 155 and a diffusion barrier for preventing the metal material from diffusing and reacting with silicon. For example, the ohmic layers may be formed by depositing refractory metal, such as Ti or Ta, to conform with the surface of each contact hole, and the diffusion barrier may be formed by depositing TiN or TaN on the surface of the ohmic layer.

As described above, the semiconductor device according to an embodiment of the present invention is configured such that the silicide layers located under the bottoms of the contact holes are not completely eliminated or punched through. Instead, the bottoms of the contact plugs contact with the tops of the silicide layers or the insides of the silicide layers. Based on this contact, the reliability and characteristics of the semiconductor device can be improved.

Figure 2:
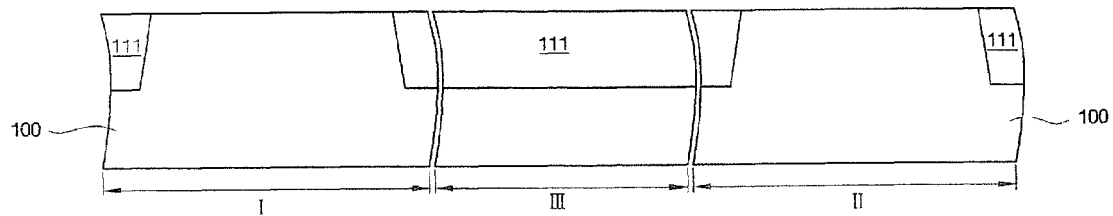
FIGS. 2-15 are cross-sectional views of intermediate structures that illustrate methods of forming the CMOS integrated circuit device of FIG. 1.

Referring now to FIGS. 2 to 14, methods of fabricating the semiconductor device shown in FIG. 1 will be described. Referring to FIG. 2, a semiconductor substrate 100 including an NMOS transistor region I and a PMOS transistor region II is provided. In this case, a boundary region III is located between the NMOS transistor region I and the PMOS transistor region II. In more detail, device isolation regions 111 are formed by performing a Local Oxidation of Silicon (LOCOS) process or a Shallow Trench Isolation (STI) process on predetermined regions of the semiconductor substrate 100. Although not shown in the drawing, a well or wells may be formed in the NMOS transistor region I and/or the PMOS transistor region II. For example, in the case where a P-type substrate is used, an n-well may be formed by injecting an N-type impurity into the PMOS transistor region II, and a p-well may be formed by injecting a P-type impurity into the NMOS transistor region I. The boundary region III is formed in the device isolation region 111. The boundary region III may also be formed in an active region in alternative embodiment of the invention.

Figure 3:
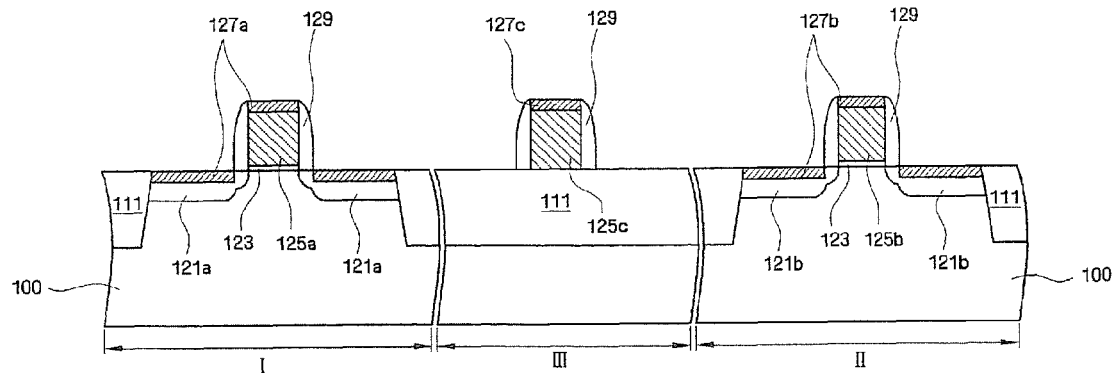

Referring to FIG. 3, an NMOS transistor and a PMOS transistor are respectively formed in the NMOS transistor region I and the PMOS transistor region II. A gate electrode 125c may be also formed in the boundary region III. The NMOS transistor includes a gate electrode 125a and N-type source/drain regions 121a, and further includes a first silicide layer 127a on the gate electrode 125a and the source/drain regions 121a. The PMOS transistor includes a gate electrode 125b and P-type source/drain regions 121b, and further includes a second silicide layer 127b on the gate electrode 125b and the source/drain regions 121b. First to third silicide layers 127a, 127b and 127c are formed on the gate electrodes and the source/drain regions included in the NMOS transistor region I, the PMOS transistor region II and the boundary region III.

In greater detail, the gate electrodes 125a, 125b and 125c are formed by forming a gate insulating layer and a conductive layer for gate electrodes on the entire surface of the semiconductor substrate 100 and then patterning these layers. Although the gate insulating layer 123 may be formed of a silicon oxide layer, the material of the gate insulating layer 123 is not limited thereto, but may be formed of a material having a relatively high dielectric constant. The gate electrodes 125a, 125b and 125c may be formed of single layers, such as polysilicon layers and metal layers, doped with different or identical conduction-type impurities, or composites of these layers.

Thereafter, a photoresist pattern (not shown) for exposing the NMOS transistor region I is formed, and N-type source/drain regions 121 are formed by injecting an N-type impurity into the substrate 100 on both sides of the gate electrode 125a. Thereafter, the photoresist pattern for exposing the NMOS transistor region I is removed, a photoresist pattern for exposing the PMOS transistor region II is formed, and P-type source/drain regions 121b are formed on both sides of the gate electrode 125b of the PMOS transistor region II. The N-type and P-type source/drain regions 121a and 121b formed as described above may be formed as a Double Diffused Drain (DDD) or Lightly Doped Drain (LDD) structure. Using the above-described method, the NMOS transistor and the PMOS transistor are realized. Reference numeral 129 designates an insulating spacer that may be formed using conventional techniques.

Thereafter, by depositing a metal layer for silicide on the entire surface of the semiconductor substrate 100, on which the NMOS and PMOS transistors are formed, and thermally treating the metal layer, first to third silicide layers 127a, 127b and 127c are formed on the gate electrode 125a, 125b and 125c, and the source/drain regions 121a and 121b, using conventional techniques.

Figure 4:
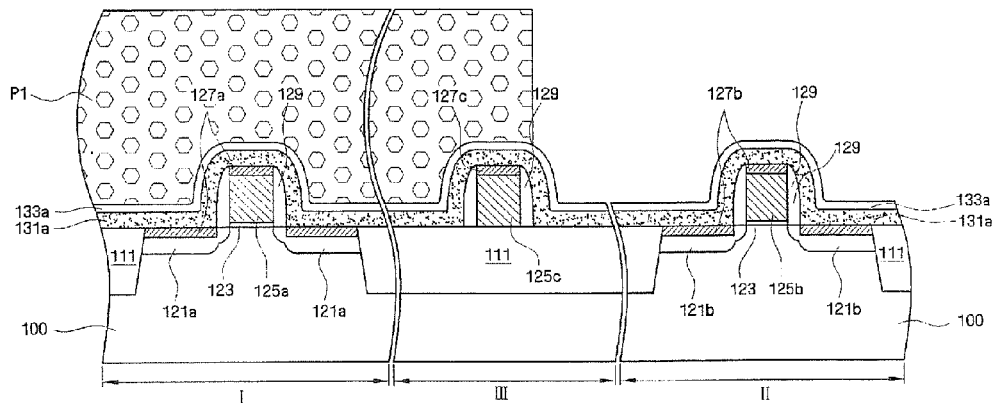

Referring to FIGS. 4 to 7, a tensile stress layer covering the NMOS transistor is formed in the NMOS transistor region, and a compressive stress layer covering the PMOS transistor is formed in the PMOS transistor region. In greater detail, as illustrated in FIG. 4, a tensile stress layer 131a is formed in respective regions, using Chemical Vapor Deposition (CVD), such as heat CVD, PECVD, or high-density plasma CVD. The thickness and material of the tensile stress layer 131a are the same as those described in conjunction with FIG. 1 above. For example, in order to form a tensile stress layer 131a made of SiN, a deposition process may be performed at a temperature in a range from about 300 to 600° C. and a pressure in a range from about 1 to 10 torr using a silicon source gas, such as $SiH_4$, and a nitrogen source gas, such as $NH_3$ or $N_2$, as source gases. Subsequently, an etching stop layer 133a may be formed on the tensile stress layer 131a. The etching stop layer 133a may be formed of the above-described LTO layer.

Figure 5:
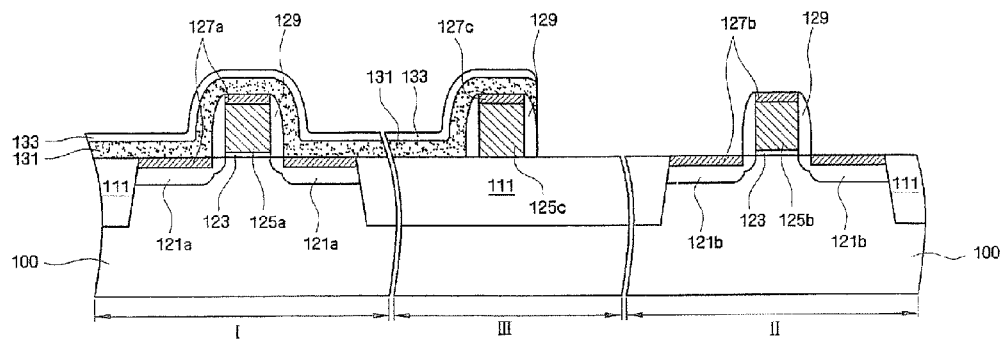

After the tensile stress layer 131a and the etching stop layer 133a are formed, a first mask pattern P1 for selectively exposing the PMOS transistor region II is formed. The first mask pattern P1 may be a photoresist pattern. In this case, the first mask pattern P1 covering the NMOS transistor region I may extend to part of the boundary region III in view of a process margin. Thereafter, as illustrated in FIG. 5, part of the tensile stress layer and part of the etching stop layer, formed in regions other than the NMOS transistor region I, are removed. Therefore, the patterned tensile stress layer 131 and the patterned etching stop layer 133 remain in the NMOS transistor region I. Such a process of removing the tensile stress layer and the etching stop layer may be performed using dry or wet etching, for example. As illustrated by FIG. 5, the tensile stress layer 131 and the etching stop layer 133a may also remain in the boundary region III. Since the formed tensile stress layer 131 can improve the mobility of carriers when high tensile stress is applied to the channel region of the NMOS transistor, the performance of the NMOS transistor is further improved.

Figure 6:
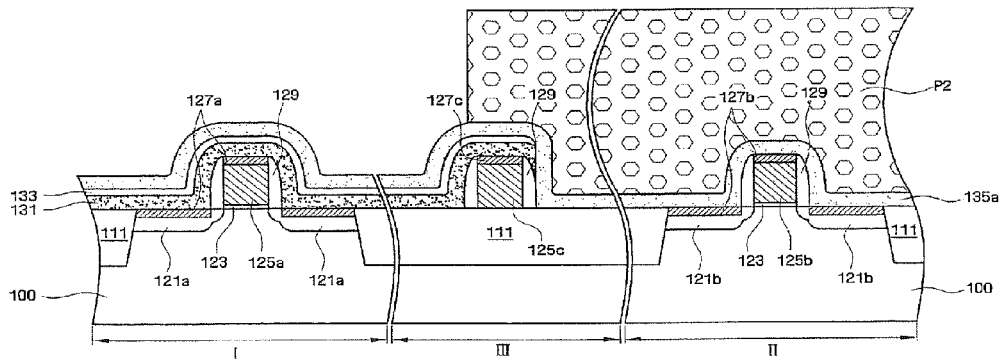
Figure 7:
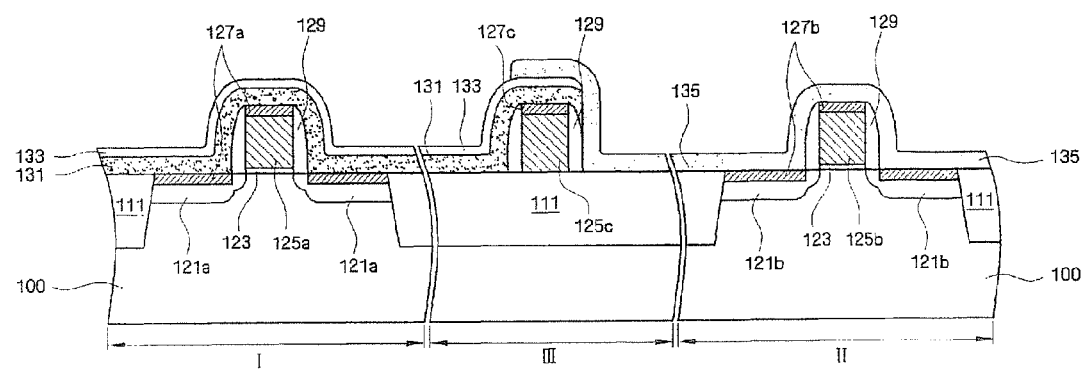

Referring to FIGS. 6 and 7, a compressive stress layer 135a may be formed in the PMOS transistor region II. First, as illustrated in FIG. 6, the compressive stress layer 135a is formed on the entire surface of a substrate. The compressive stress layer 135a may be formed using CVD, such as heat CVD, PECVD, or high-density plasma CVD. The thickness and material of the compressive stress layer 135a are the same as those described in conjunction with FIG. 1 above. In this case, the compressive stress layer 135a may be formed on the previously formed NMOS transistor region I, that is, on the patterned tensile stress layer 131 and the patterned etching stop layer 133a. Thereafter, a second mask pattern P2, such as a photoresist pattern for selectively exposing the NMOS transistor region I, is formed. In this case, the second mask pattern P2 covering the PMOS transistor region II may extend to part of the boundary region III in view of a process margin.

Thereafter, as illustrated in FIG. 7, by etching part of the compressive stress layer 135a and removing the second mask pattern P2 from the region exposed by the second mask pattern P2, a patterned compressive stress layer 135 is made to remain in the PMOS transistor region II. In this case, part of the patterned compressive stress layer 135 remains in the boundary region III. As a result, the patterned tensile stress layer 131, the patterned etching stop layer 133 and the patterned compressive stress layer 135 are all laminated together in the boundary region III. The laminate layer may be located on the third silicide layer 127c formed in the boundary region III. The process of removing the compressive stress layer may be performed using dry or wet etching, for example. Although, in the above-described method of fabricating a semiconductor device, the process of forming the tensile stress layer 131 is performed prior to the process of forming the compressive stress layer 135, the sequence of the processes is not limited thereto, but, conversely, the compressive stress layer 135 may be formed before the tensile stress layer 131 is formed. In this case, the etching stop layer 133 may be formed on the compressive stress layer 135, instead of the tensile stress layer 131.

Figure 8:
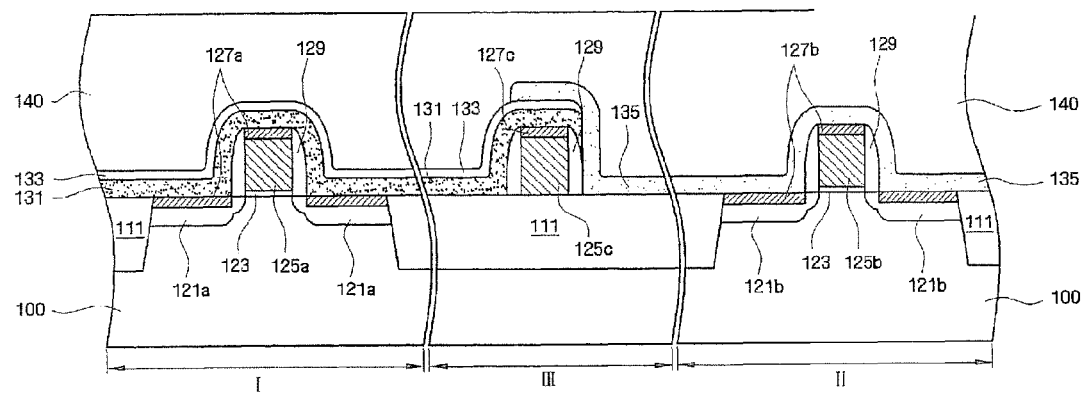

Referring to FIG. 8, an interlayer dielectric 140 is formed on the entire surface of the semiconductor substrate. The interlayer dielectric 140 may be made of $O_3$-Tetra Ethyl Ortho Silicate (O3-TEOS), Undoped Silicate Glass (USG), PhosphoSilicate Glass (PSG), Borosilicate Glass (BSG), BoroPhospho Silicate Glass (BPSG), Fluoride Silicate Glass (FSG), Spin On Glass (SOG), Tonen SilaZene (TOSZ), or a combination thereof. In this case, although the interlayer dielectric 140 may be formed using CVD or spin coating, the method of forming the interlayer dielectric 140 is not limited thereto.

Figure 9:
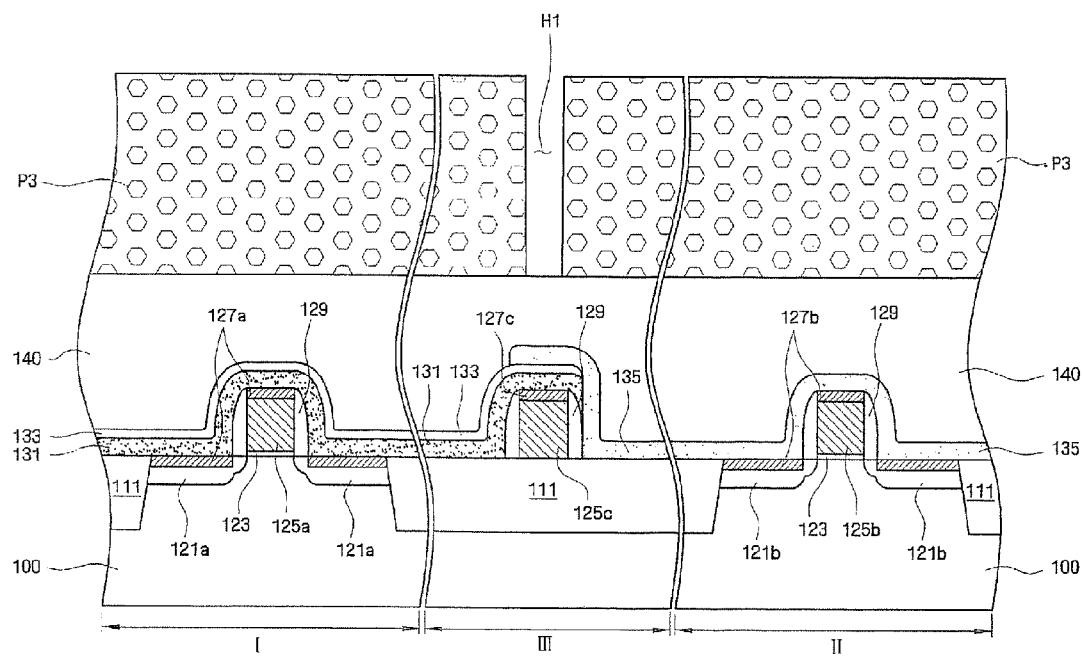
Figure 10:
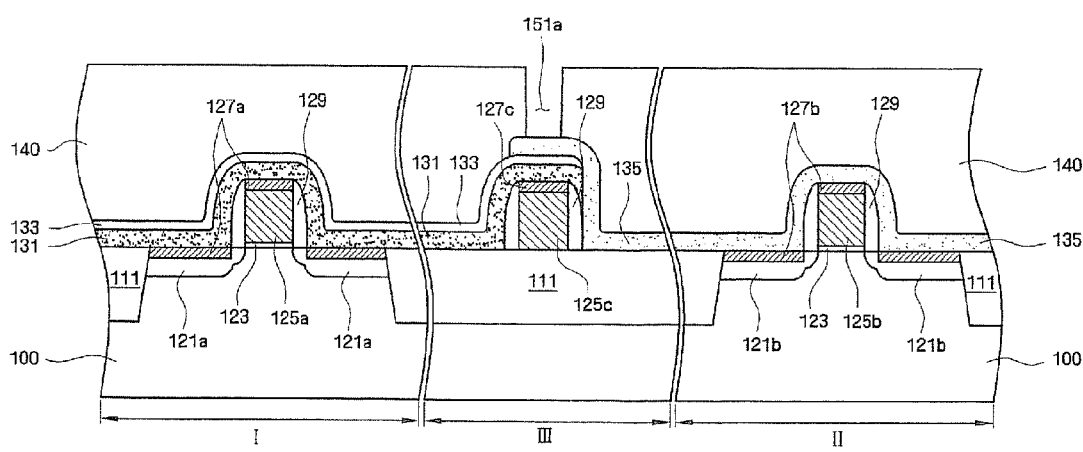

Referring now to FIGS. 9 and 10, a first preparatory contact hole is formed in the boundary region III by performing a first etching process. For this purpose, as illustrated in FIG. 9, a third mask pattern P3 having a first opening H1 for forming the first contact hole in the interlayer dielectric 140 is formed. In this case, the third mask pattern P3 may be a photoresist pattern. Subsequently, as illustrated in FIG. 10, the first preparatory contact hole 151a, which passes through the interlayer dielectric 140 and exposes the top of the compressive stress layer 135 located on the third silicide layer 127c formed in the boundary region III, is formed using the third mask pattern P3 as an etching mask.

Figure 11:
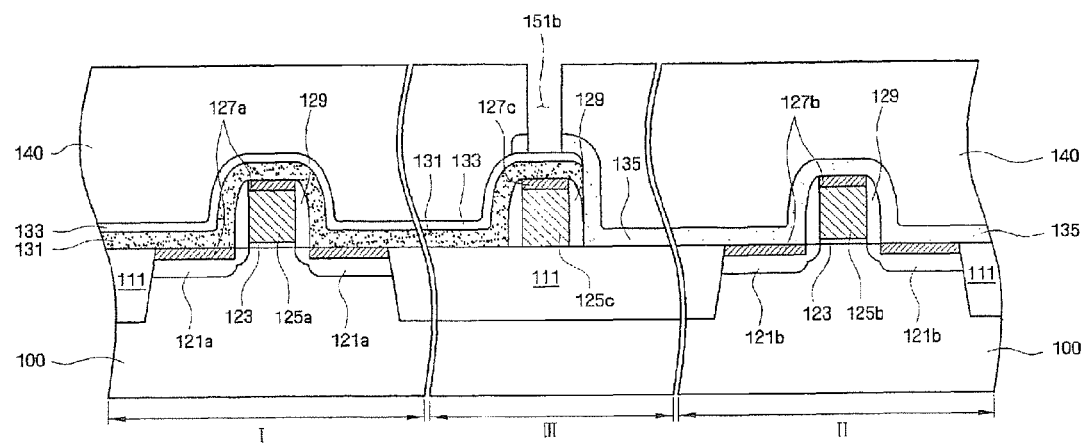
Figure 12:
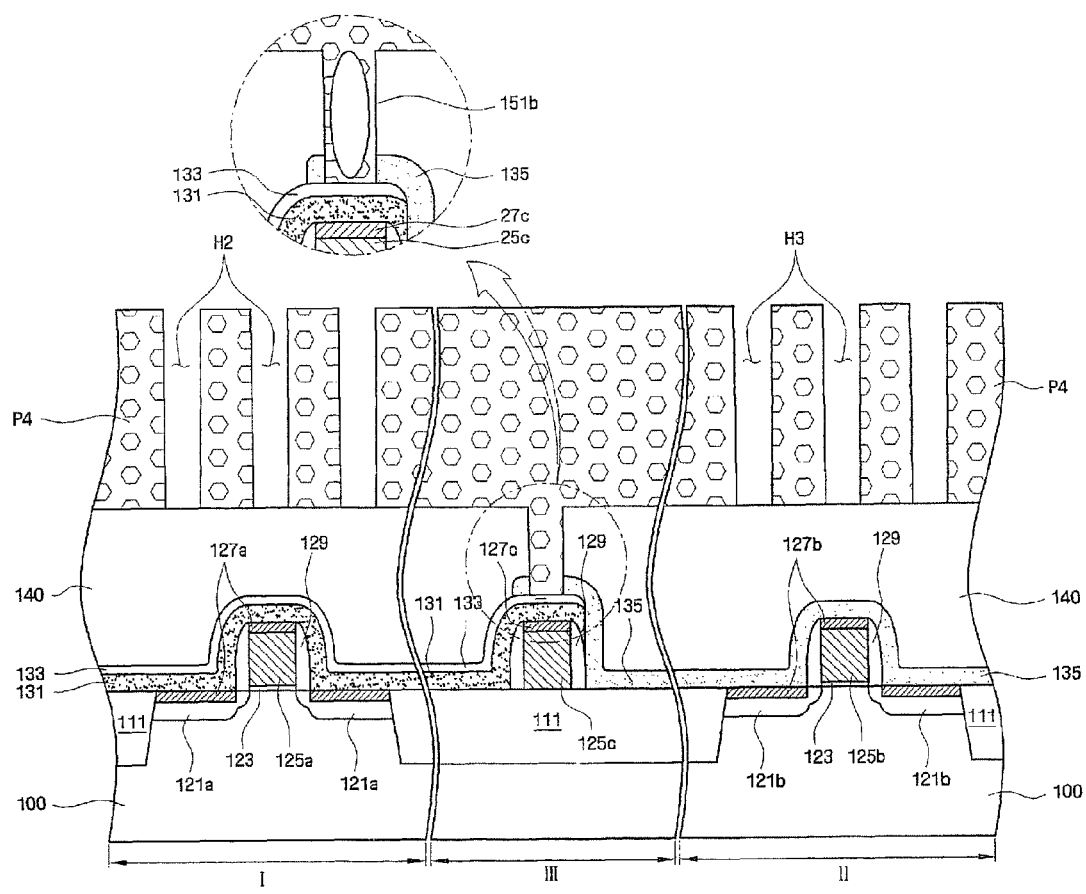

Thereafter, referring to FIG. 11, the third mask pattern P3 is removed, and the first preparatory contact hole 151b is extended to penetrate into the compressive stress layer 135, located below the first preparatory contact hole 151b, using the interlayer dielectric 140 as an etching mask. As a result, the first preparatory contact hole 151b for exposing the top of the etching stop layer 133 is realized. As illustrated in FIG. 11, although the bottom of the first preparatory contact hole 151b may expose the top of the etching stop layer 133, the present invention is not limited thereto, but the case where the bottom of the first preparatory contact hole 151b exists in the etching stop layer 133 is not excluded. Thereafter, referring to FIGS. 12 to 15, first to third contact holes are formed using a second etching process. As illustrated in FIG. 12, a fourth mask pattern P4 having openings H2 and H3 for forming second and third preparatory contact holes in the NMOS transistor region I and the PMOS transistor region II, is formed on the interlayer dielectric 140. This fourth mask pattern P4 may be a photoresist pattern. In this case, the first preparatory contact hole 151b may be filled with material constituting the fourth mask pattern P4. The partial filling of the first preparatory contact hole 151b can reduce the amount of residue in the contact hole in a subsequent process of removing a mask pattern, so the partial filling is advantageous in view of the overall process.

Figure 13:
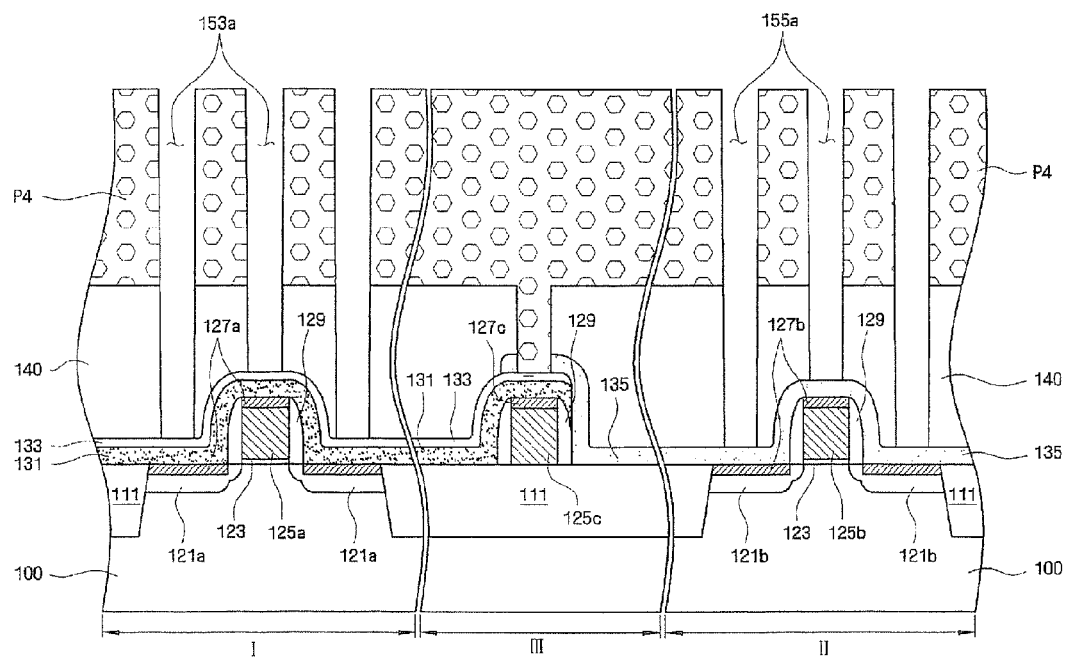

As illustrated in FIG. 13, using the fourth mask pattern P4 as an etching mask, anisotropic etching is performed on the interlayer dielectric 140 and the second and third preparatory contact holes 153a and 155a are formed. In this case, the bottom of the second preparatory contact hole 153a may be located on the top of the etching stop layer 133 or inside the etching stop layer 133, and the bottom of the third preparatory contact hole 155a may be located on the compressive stress layer 135. Accordingly, only a single stress layer may exist under the first preparatory contact hole 151b as well as the second preparatory contact hole 153b and the third preparatory contact hole 155a.

Figure 14:
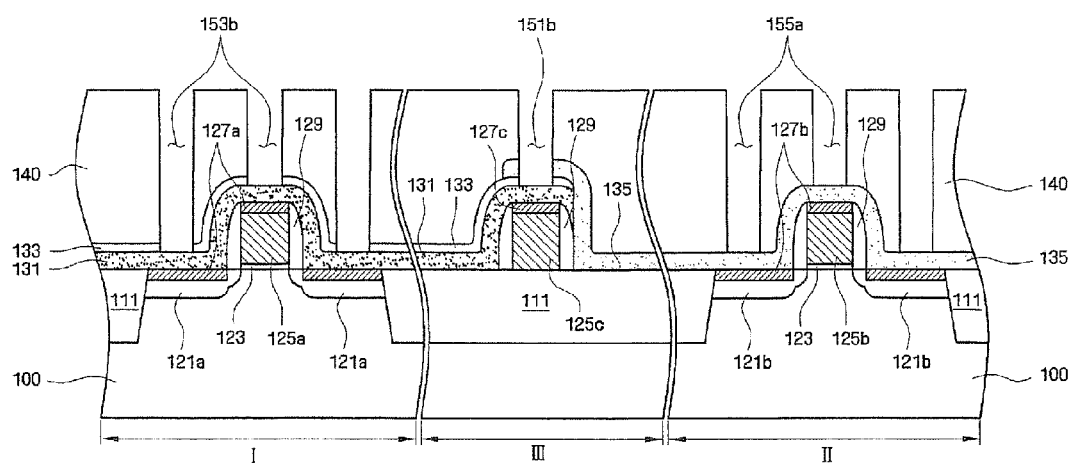

Thereafter, as illustrated in FIG. 14, the fourth mask pattern P4 is removed by performing an ashing process. At this time, part of the etching stop layer 133 or the entire etching stop layer 133, which are exposed to the bottoms of the first and second preparatory contact holes 151a and 153a, as illustrated in FIG. 13, may be removed along with the fourth mask pattern P4. When the entire etching stop layer 133 is removed, the bottoms of the first and second preparatory contact holes 151b and 153b are located on the tensile stress layer 131, as illustrated in FIG. 14.

Figure 15:
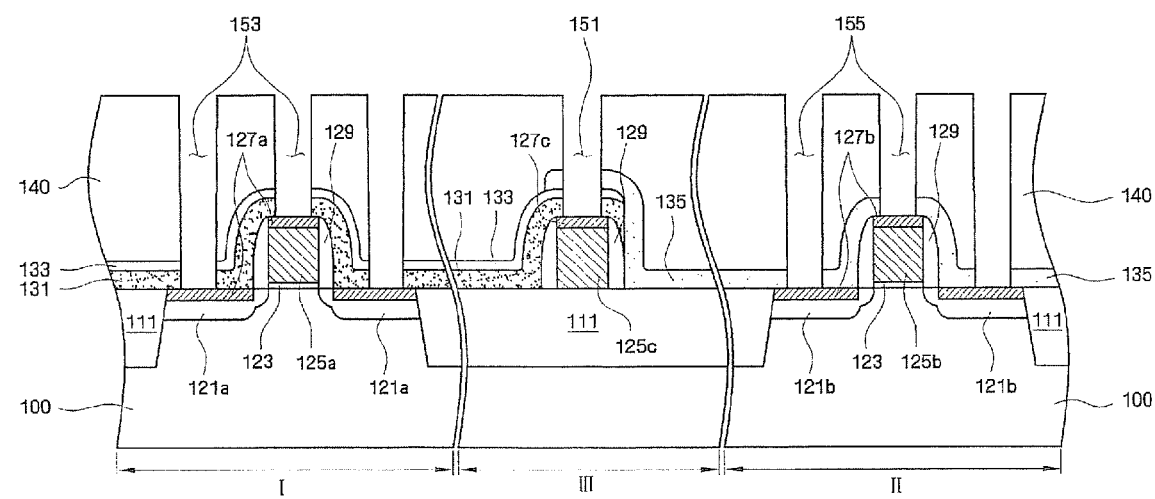

Referring to FIG. 15, the bottoms of the first to third contact holes 151, 153 and 155, located on the top of the silicide layer or inside the silicide layer, are formed. That is, the first to third contact holes 151, 153 and 155, passing through the tensile stress layer or the compressive stress layer, can be simultaneously formed by extending the bottoms of the first to third preparatory contact holes 151b, 153b and 155a.

Since the stress layers remaining under the first to third preparatory contact holes 151b, 153b and 155a are all single layers, and thus have similar thicknesses, there is no risk that excessive etching will occur in the etching process of realizing the first and third contact holes 151, 153 and 155 by removing the stress layer exposed to the bottoms of the first and third contact holes 151, 153 and 155. Accordingly, the silicide layer, located under the stress layers, may not be punched through, and the bottoms of the contact holes may exist on the bottoms of the silicide layers 127a, 127b and 127c or inside the silicide layers 127a, 127b and 127c. Furthermore, the process of forming the first to third contact holes 151, 153 and 155 by extending the first to third preparatory contact holes may be formed using wet etching or dry etching. At this time, the interlayer dielectric 140, through which the first to third preparatory contact holes are formed, may be used as an etching mask.

Subsequently, the semiconductor device shown in FIG. 1 may be finally fabricated by forming contact plugs 161, 163 and 165 in the first to third contact holes 151, 153 and 155.

The contact plugs 161, 163 and 165 may be filled with metal material, such as W, Cu or Al, or conductive material, such as conductive polysilicon. Although not shown in the drawing, barrier layers (not shown) may be formed to conform with the insides of the contact holes 151, 153 and 155 before the contact holes 151, 153 and 155 are filled with the conductive material. Each of the barrier layers may include an ohmic layer, for improving the contact of the metal layer filling each of the contact holes 151, 153 and 155, and a diffusion barrier for preventing the metal material from diffusing and reacting with silicon. For example, the ohmic layers may be formed by conformally depositing refractory metal, such as Ti or Ta, along the surface of each contact hole, and the diffusion barriers may be formed by depositing TiN or TaN along the surface of the ohmic layer. In the process of forming the contact plugs, a planarization process, such as Chemical Mechanical Polishing (CMP) or an etch back process, may be performed until the surface of the interlayer dielectric 140 is exposed.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An integrated circuit device, comprising:
    a semiconductor substrate having a plurality of transistors therein;
    a first electrically insulating layer on first and second ones of the plurality of transistors, said first electrically insulating layer having a sufficiently high internal stress characteristic to impart a net tensile stress in a channel region of the first one of the plurality of transistors;
    a second electrically insulating layer on the second one and a third one of the plurality of transistors, said second electrically insulating layer having a sufficiently high internal stress characteristic to impart a net compressive stress in a channel region of the third one of the plurality of transistors;
    an interlayer dielectric layer on said first and second electrically insulating layers; and
    a contact plug that extends through the first and second electrically insulating layers and through a portion of an etching stop layer extending between the first and second electrically insulating layers, and electrically contacts a gate electrode of the second one of the plurality of transistors.

2. A semiconductor device comprising:
    a semiconductor substrate having a first transistor region and a second transistor region;
    a first transistor formed in the first transistor region, and configured to comprise a gate electrode and a first conduction-type source/drain region, the gate electrode and the first conduction-type source/drain region being provided with a first silicide layer on tops thereof;
    a second transistor formed in the second transistor region, and configured to comprise a gate electrode and a second conduction-type source/drain region, the gate electrode and the second conduction-type source/drain region being provided with a second silicide layer on tops thereof;
    a boundary region provided with a third silicide layer on a top thereof, and located at a border between the first transistor region and the second transistor region;
    a first stress layer and an etching stop layer covering the first transistor region and extending to the boundary region;
    a second stress layer covering the second transistor region, extending to the boundary region, and overlapping the etching stop layer located in the boundary region;
    an interlayer dielectric covering an entire surface of the semiconductor substrate;
    a first contact hole located in the boundary region, and configured to pass through the interlayer dielectric, the second stress layer, the etching stop layer and the first stress layer, and to have a bottom that exists inside or on a top of the third silicide layer provided in the boundary region;
    a second contact hole located in the first transistor region, and configured to pass through the interlayer dielectric, the etching stop layer and the first stress layer and to have a bottom that exists inside or on a top of the first silicide layer provided in the first transistor region;

a third contact hole located in the second transistor region, and configured to pass through the interlayer dielectric and the second stress layer and to have a bottom that exists inside or on a top of a second silicide layer provided in the second transistor region; and contact plugs filling the first to third contact holes.

3. The integrated circuit device of claim 1, wherein the first and third ones of the plurality of transistors have opposite conductivity type.

4. The semiconductor device of claim 2, wherein:

the first transistor and the second transistor are an NMOS transistor and a PMOS transistor, respectively; and the first stress layer and the second stress layer are a tensile stress layer and a compressive stress layer, respectively.

5. The semiconductor device of claim 2, wherein the first stress layer and the second stress layer each are an SiN, SION, SiC, SiCN or SiO2 layer, or a layer formed of a combination thereof.

6. The semiconductor device of claim 2, wherein the etching stop layer is an LTO layer.

7. The semiconductor device of claim 2, wherein the silicide layer is a silicide layer made of metal such as Co, Ni, Ti, Ta, or W.

* * * * *